United States Patent [19]

Van Rens et al.

[11] Patent Number: 5,067,138
[45] Date of Patent: Nov. 19, 1991

[54] PHASE-LOCKED-LOOP CIRCUIT AND BIT-DETECTION ARRANGEMENT COMPRISING SUCH A PHASE-LOCKED-LOOP CIRCUIT

[75] Inventors: Antonia C. Van Rens; Eise C. Dijkmans; Eduard F. Stikvoort, all of Eindhoven, Netherlands

[73] Assignee: U.S. Philips Corporation, New York, N.Y.

[21] Appl. No.: 344,184

[22] Filed: Apr. 27, 1989

Related U.S. Application Data

[63] Continuation-in-part of Ser. No. 285,131, Dec. 15, 1988, Pat. No. 4,912,729.

[30] Foreign Application Priority Data

May 16, 1988 [NL] Netherlands ............... 8801254

[51] Int. Cl.$^5$ .............................................. H03D 3/02
[52] U.S. Cl. .................................. 375/81; 329/307
[58] Field of Search ............... 375/106, 108, 111, 110, 375/113, 114, 118, 120, 81; 328/133, 134, 63, 72; 329/307; 331/1 A, 1 R

[56] References Cited

U.S. PATENT DOCUMENTS

| | | | |
|---|---|---|---|
| 4,543,531 | 9/1985 | Sugita et al. ...................... | 375/110 X |
| 4,712,223 | 12/1987 | Nelson ................................... | 375/43 |
| 4,807,254 | 2/1989 | Otani ................................... | 375/106 X |
| 4,807,257 | 2/1989 | Schouhamer et al. ............... | 375/106 |

Primary Examiner—Benedict V. Safourek
Assistant Examiner—Tesfaldet Bocure
Attorney, Agent, or Firm—Edward W. Goodman

[57] ABSTRACT

A digital phase-locked-loop circuit is provided for deriving from a sequence of samples ($J_1, \ldots J_{20}$) of a band-limited data signal ($Vt$), the phase of the data signal at the sampling instants. The circuit includes a discrete-time oscillator 10 for generating a sequence of phase values ($F_1, \ldots F_{20}$) which characterize a periodic signal ($Vk1$) having an amplitude which varies as a linear function of time between two constant limit values ($E_1, -E$). The frequency of the periodic signal ($Vk1$) characterized by the phase values is proportional to a control value ($I$). An interpolation circuit (2) derives from the samples ($J_1, \ldots J_{20}$) the relative positions ($tf/T$) occupied by the detection-level crossings of the data signal ($Vt$) relative to the sampling instants. A phase detector (3) derives the difference ($\Delta F$) between the actual phase of the data signal ($Vt$) and the phase as indicated by the phase values ($F$) from the relative positions ($tf/T$) and the phase values ($F$). The discrete-time oscillator (10) is controlled by a digital sequential filter (9) in such a way that the phase difference remains substantially zero.

11 Claims, 6 Drawing Sheets

PHASE-LOCKED-LOOP CIRCUIT AND BIT-DETECTION ARRANGEMENT COMPRISING SUCH A PHASE-LOCKED-LOOP CIRCUIT

This application is continuation-in-part of 07/285,131 now U.S. Pat. No. 4,912,729 issued 3/27/90.

BACKGROUND OF THE INVENTION

1. Field of the Invention

The invention relates to a phase-locked-loop circuit for deriving from a sequence of samples of a band-limited data signal the phase of the data signal at the corresponding sampling instants, the phase-locked loop circuit comprising signal-generating means for generating in synchronism with the samples, a sequence of phase values characterizing a periodic signal which varies as a substantially linear function of time between two constant limit values with a frequency which proportional to a control value; means for deriving interpolation values, from the samples by interpolation, the interpolation values indicating the relative positions with respect to the sampling instants of the instants at which the data signal crosses a detection-level; phase-comparison means for deriving from the phase values, and the interpolation values a difference value which is indicative of the difference between the phase represented by the phase value and the actual phase of the data signal; and control means for controlling the signal-generating means depending on the difference value in such a way that the phase indicated by the phase value is maintained substantially equal to the actual phase of the data signal.

The invention further relates to a bit-detection arrangement for converting the sequence of samples into a binary signal made up of bit cells, this bit-detection arrangement comprising such a phase-locked-loop circuit.

2. Description of Related Art

Such circuits are known from European Patent Application EP 0,109,837. In the known phase-locked-loop circuit, the signal-generating means for generating the sequence of phase values comprise a discrete-time oscillator, comprising a digital summing circuit having a limited summing range, the phase value stored in the summing circuit being adapted by means of the control value. The range of the summing circuit corresponds to 360° and the control value is constant and corresponds to 180°. The sampling rate is substantially equal to twice the bit rate of the data signal, so that the periodic signal characterized by the phase value has a frequency substantially equal to the bit rate. Since the phase of the data signal at the instants of crossing of the detection-level is known zero), the difference between the actual phase and the phase represented by the phase value can be determined after every detection-level crossing. After the difference has been determined, the phase value is adapted depending on this difference in such a way that after adaptation, the phase represented by the phase value substantially corresponds to the actual phase. In this way the periodic signal characterized by the phase values and the data signal are locked in phase, so that at the sampling instants between the detection-level crossings, the phase value supplied by the discrete-time oscillator is always representative of the phase of the data signal. Each time that the phase value has exceeded a value corresponding to the phase "0" a, bit-detection circuit detects a bit having a logic value dictated by the sign of the last sample.

This phase-locked-loop circuit and bit-detection circuit can be constructed entirely by means of digital elements, which has the advantage that these circuits together with the digital circuits for processing the information, for example decoding circuits and error-correction circuits, can be integrated simply on one chip.

However, the known circuits have the disadvantage that for a reliable bit detection, the bit rate should be substantially equal to half the sampling rate. If the bit rate deviates from this value, the phase shift between two successive samples no longer corresponds to 180°, so that the phase as represented by the phase value will deviate increasingly from the actual phase as the time interval between successive detection-level crossing increases, which may lead to erroneous bit detections.

SUMMARY OF THE INVENTION

It is an object of the invention to provide a phase-locked-loop circuit as defined in the opening paragraph, in which the the bit rate has a substantially smaller influence on the operation of the circuit.

According to the invention this object is achieved in that the phase-comparison means are adapted to determine a linear combination of the phase value and the product of the interpolation value and the control value in order to derive the difference value, the control means being constructed to adapt the control value depending on the linear combination thus determined.

By adapting the control value, the frequency of the periodic function characterized by the phase value is always maintained equal to the bit rate. Moreover, the sensitivity of the phase-comparison means is independent of the bit rate, so that the control characteristic of the phase-locked-loop is also bit rate independent, which enables the control characteristic of the phase-locked-loop to be optimized for a large range of bit rates.

It is to be noted that European Patent Application EP 0 241 974 describes a digital phase-locked-loop circuit in which the frequency of the function characterized by the phase values is also maintained equal to the bit rate. In this case the range of the discrete-time oscillator, which range is defined by the limit value, is adapted. However, this has the drawback that the number of bits required to represent the phase value is bit-rate dependent, which leads to a comparatively complex discrete-time oscillator. Moreover, the frequency correction of the signal characterized by the phase value is inversely proportional to the detected phase difference, which results in a nonlinear transfer characteristic of the phase-locked-loop. In addition, the sensitivity of the employed phase-comparison means is bit-rate dependent, resulting in a bit-rate dependent transfer characteristic of the phase-locked-loop. This has the disadvantage that the transfer characteristic can be optimized for only one bit rate.

Finally, in said phase-locked-loop circuit significant errors may occur in the detected phase difference, which necessitates the use of additional correction circuits.

In addition to said digital phase-locked-loop circuit, said European Patent Application 0,241,974 describes another circuit in which the frequency of the periodic signal characterized by the phase value is adjusted depending on the detected phase difference. However, the frequency of said periodic signal is now maintained equal to the difference in frequency between the bit rate and the sampling rate, enabling the circuit to be used only for bit rates between one times the sampling rate and two times the sampling rate. Moreover, the phase-detection sensitivity in this circuit is also bit-rate dependent and, moreover, additional correction circuits are needed to provide a correction for erroneously phase-difference detections.

An embodiment of the phase-locked-loop circuit is characterized in that the control means comprise means for limiting the control value to values situated between a third and a fourth limit value, the third and fourth limit values respectively corresponding to a minimum and maximum permissible frequency of the periodic signal characterized by the phase values.

By limiting the control value it is achieved that the frequency of the signal characterized by the phase value can vary only within a limited frequency range, which reduces the likelihood of a phase lock at an undesired frequency.

The embodiments of the phase-locked-loop circuit described above perform well. However, if the frequency component in the data signal to which the phase-locked-loop circuit locks drops out temporarily, for example as a result of a fault in the signal-transmission path, the frequency of the discrete-time oscillator is found to drift away very rapidly. This has the drawback that after the fault condition has ceased, the phase-locked-loop circuit requires a comparatively long time to come back into lock, which leads to an undesirable loss of information.

An embodiment of the circuit which mitigates this drawback is characterized in that the circuit comprises a correction circuit for correcting the difference value $\Delta F$, the relationship f between the corrected difference value $\Delta F^*$ and the original difference value substantially complying with:

$$\sum_{k=1}^{n-1} f(2\pi k/N + \Delta F) = 0$$

and $$\sum_{k=0}^{k-1} f(2\pi k/N + \Delta F) = 0$$

where k and N are integers and where f' is the derivative of the relationship f with respect to $\Delta F$.

This solution is based on the recognition of the fact that if said frequency component in the transmission signal drops out, the average detected phase error $\Delta F$ is unequal to zero, so that the frequency of the discrete-time oscillator is changed. The average residual error of $\Delta F$ is caused by the discrete nature of the discrete-time time oscillator. This residual error is eliminated by adding the correction network.

A function which complies with said requirement imposed on the relationship between the corrected phase difference $\Delta F^*$ and the uncorrected phase difference $\Delta F$ is a sine function. The correction circuit can be realized simply by means of a digital memory in which the relevant relationship is stored as a look-up table.

An embodiment of the bit-detection arrangement is characterized in that the signal-generating means comprises a digital summing circuit for adapting an n-bit sum value by means of the control value in synchronism with the sampling-clock signal, the n−1 least significant bits representing the phase values, and the bit-detection arrangement comprising means responsive to a change in logic value of the most significant bit of the sum value to generate a clock pulse of a bit-clock signal which is in synchronism with the binary signal.

This embodiment has the advantage that the bit-clock signal is generated in a very simple and reliable manner.

A further embodiment of the bit-detection arrangement is characterized in that the bit-detection arrangement comprises means for deriving the logic values of the bit cells from the signs of the samples at the instants at which the clock pulses of the bit clock signal are generated, means for comparing the phase value generated immediately after the detection-level crossing with the difference value, and means for inverting the logic value of the associated bit cell depending on the result of the comparison.

In this embodiment the logic values of the bit cells are detected in a simple manner, in such a way that erroneously detected logic values of the bit cells at the detection-level crossings are corrected.

BRIEF DESCRIPTION OF THE DRAWINGS

Embodiments of the phase-locked-loop circuit and the bit-detection arrangement and the advantages thereof will be described in more detail with reference to FIGS. 1 to 12, in which.

DESCRIPTION OF THE PREFERRED EMBODIMENT

Figure 1:
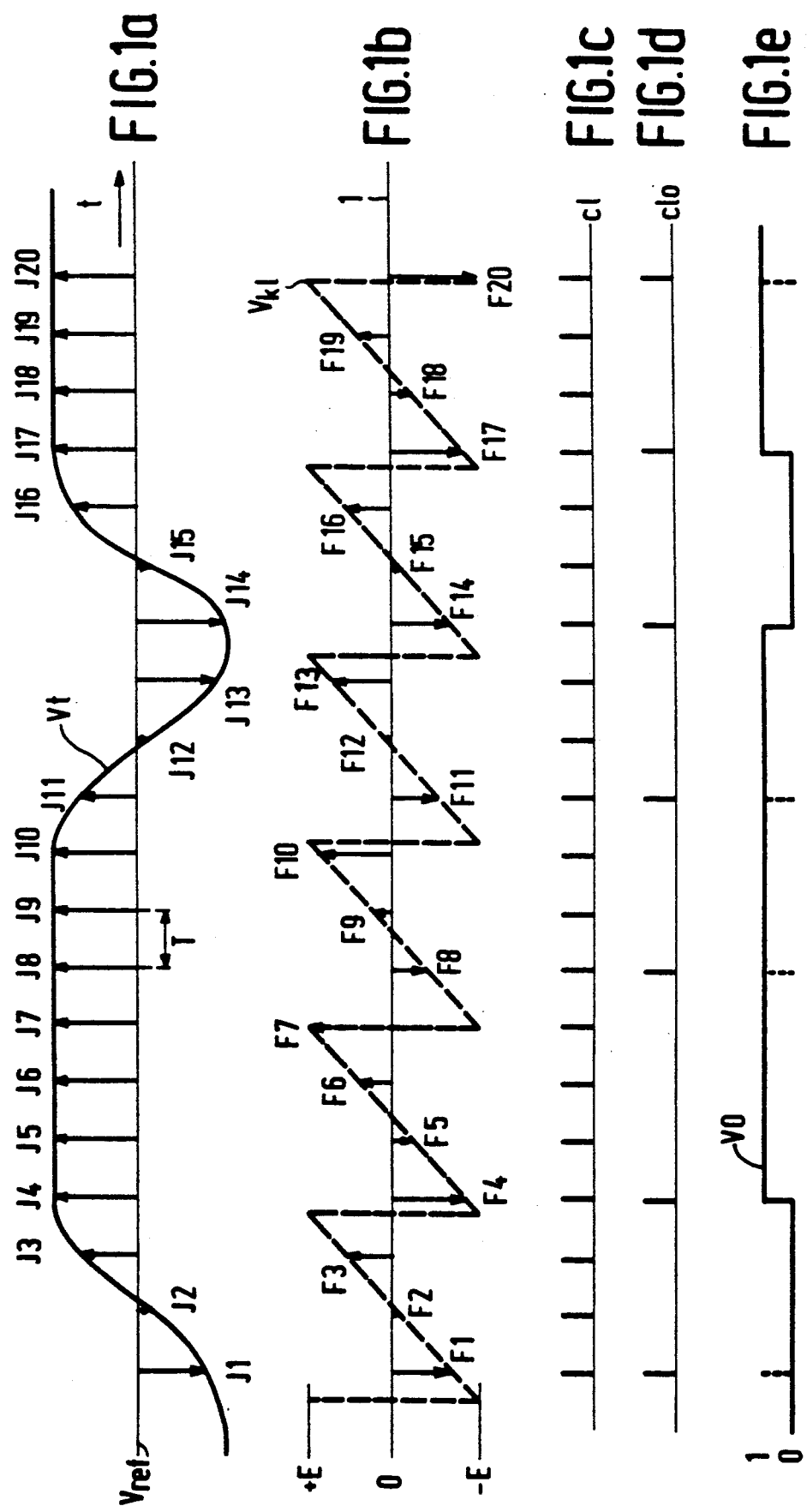
FIGS. 1a, 2, 5 and 7a–7b by way of illustration, show a number of signals occurring in the bit-detection arrangement as a function of time.

FIG. 1a shows a sequence of equidistant samples J1, ... J20 as a function of time, which samples represent a band-limited data signal Vt. Such a data signal can be obtained, for example, from a read apparatus for reading digital information recorded on a magnetic or optically readable record carrier. Such a signal comprises a plurality of binary bit cells which are transmitted in synchronism with a channel clock and which are representative of the information being read. To recover the digital information, the phase of the data signal at the sampling instants must be known. A digital phase-locked-loop circuit, to be described in detail hereinafter, generates a sequence of phase values F1, ..., F20 (see FIG. 1b), which are representative of the phase of the data signal Vt at the sampling instants. This sequence of phase values characterizes a periodic signal Vkl which varies as a linear function of time between two limit values −E and +E at a frequency equal to the bit rate of the data signal. The limit value +E corresponds to a phase of 180° and the value −E corresponds to the phase of −180°. By means of the phase-locked-loop circuit to be described hereinafter, the crossings of the data signal with a detection-level Vref are made to coincide substantially with the crossings of the periodic signal Vk1 with the zero level indicated by a line 1. The digital information represented by the samples J1, ..., J20 can be recovered simply by detecting the sign of the first sample taken after the step change of the periodic signal Vk1. Depending on the sign of this sample, a bit of a first logic value (0) or of a second logic value (1) is detected (see FIG. 1e).

A bit clock signal clo (see FIG. 1d) representing the instants at which a bit is detected can be derived from the sampling-clock signal cl (see FIG. 1c) by selecting those pulses of the sampling-clock signal cl which represent the first sampling instant after the step change of the signal Vk1.

It is to be noted that instead of the sample taken directly after the step change, it is possible to use other samples for determining the logic value of the detected bit, such as for example the samples situated nearest the step change.

Figure 2:
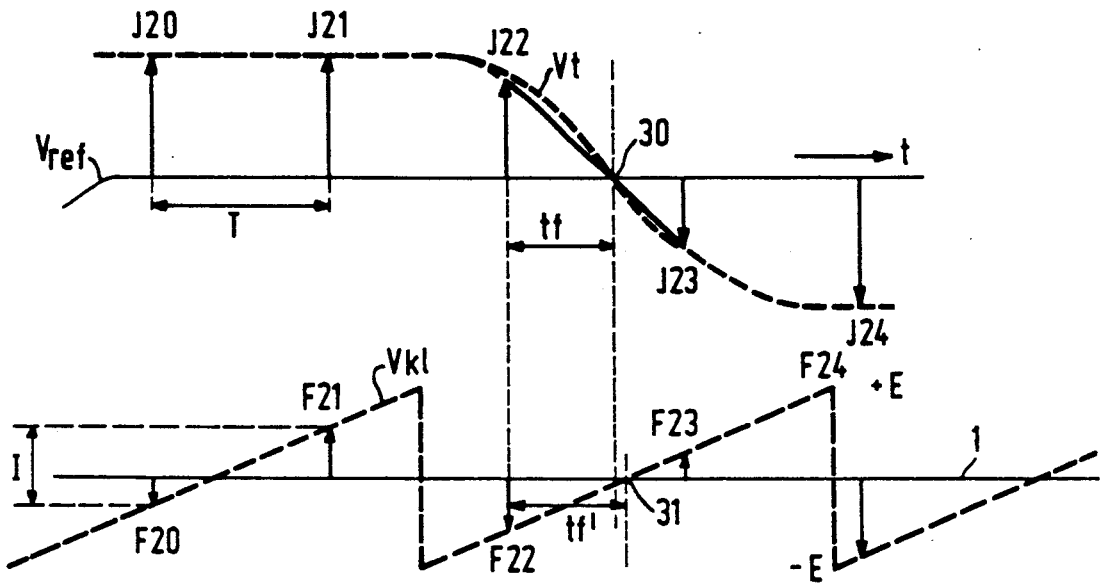

The phase lock between the data signal Vt and the function characterized by the phase value can be achieved by determining the phase difference between the data signal) Vt and the periodic signal Vk1 at every crossing of the signal Vt with the detection level Vref and subsequently adapting the frequency of the signal Vk1 depending on the phase difference thus determined. How this phase difference is determined will be described in detail with reference to FIG. 2.

For this purpose a measure of the difference between the position of the crossing 30 of the data signal Vt with the detection-level Vref and the position of the crossing 31 of the signal Vk1 with the line 1 is derived from the values of the samples J and the phase values F.

The position 30 relative to the sample (J22) situated just before the detection-level) crossing can be determined simply by interpolation using the following relationship:

$$tf/T = |a/(a-b)| \quad (1)$$

where:
tf is the time interval between the detection-level crossing 30 and the sampling instant (J22) immediately before this detection-level crossing,
T is the sampling interval,
a is the value of the sample (J22) situated directly before the detection-level crossing, and
b is the value of the sample (J23) situated directly after the detection-level crossing.

The position 31 relative to the sample directly preceding the detection-level crossing can be determined by the relationship:

$$tf/T = -Ca/I \quad (2)$$

where:
Ca corresponds to the phase value associated with the sample (J22) directly preceding the detection-level crossing, and
I represents the difference between the two successive phase values F.

A measure $\Delta F$ of the phase difference can be derived by means of the following relationship:

$$\Delta F = Ca + I.|a/(a-b)| \quad (3)$$

This measure $\Delta F$ is independent of the frequency of the signal Vk1. The advantage of this will be explained hereinafter.

Figure 3:
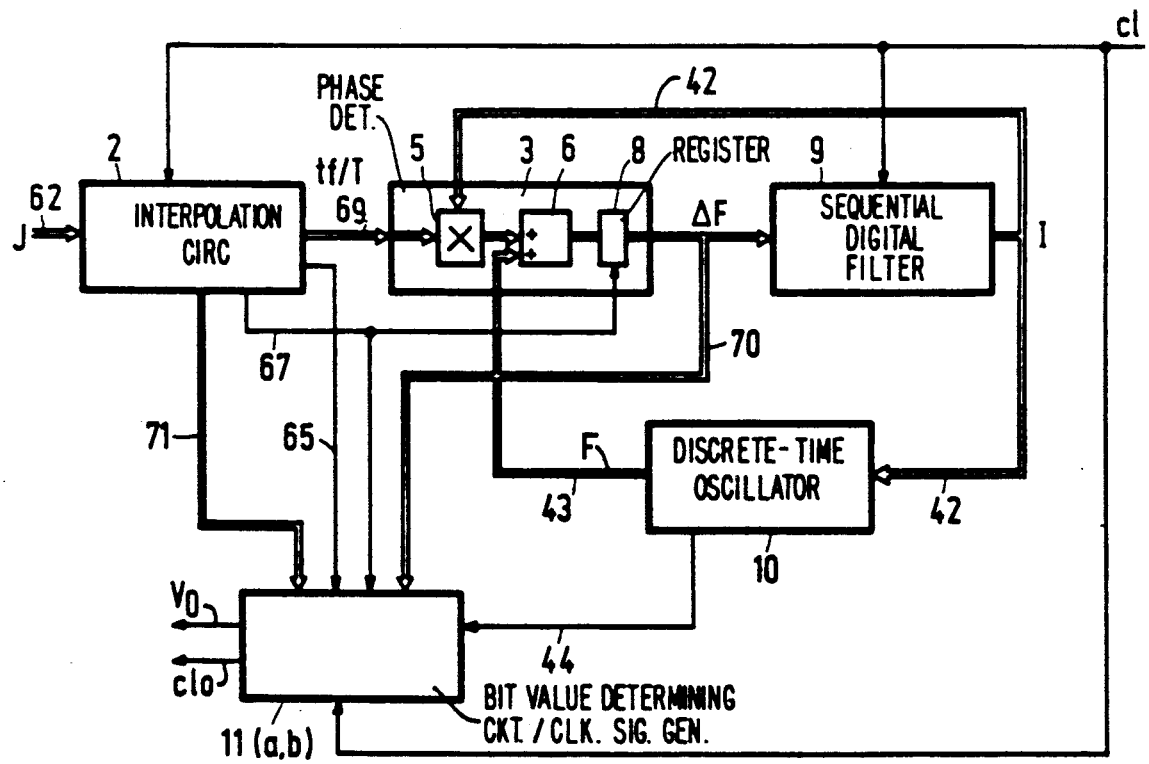
FIG. 3 shows an embodiment of the bit-detection arrangement in accordance with the invention.

FIG. 3 shows a bit-detection arrangement in accordance with the invention. This bit-detection arrangement comprises a digital phase-locked-loop circuit, comprising an interpolation circuit 2, a phase detector 3, a sequential digital filter 9 and a discrete-time oscillator 10. The discrete-time oscillator 10 generates the phase words F in synchronism with these samples.

Figure 4:
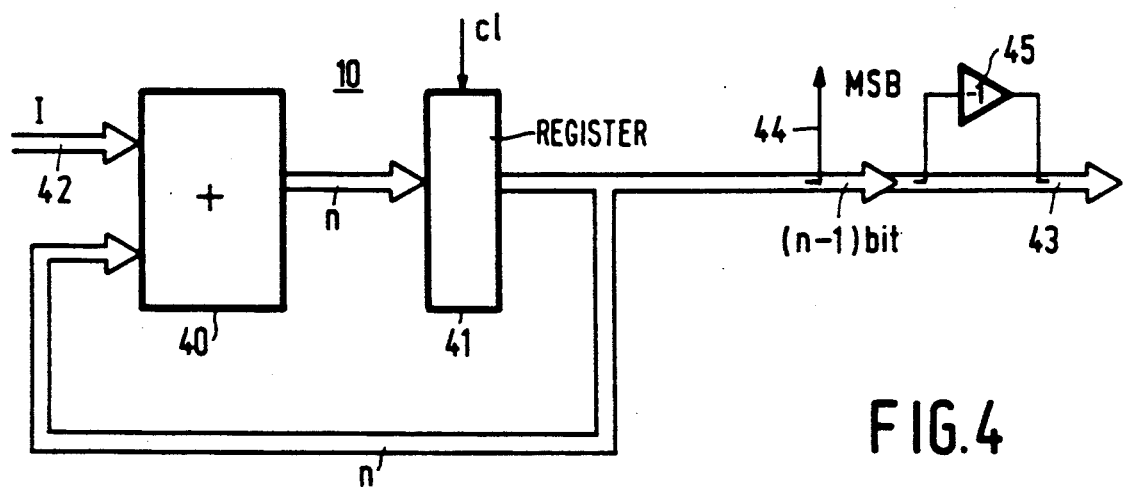
FIG. 4 shows an example of a discrete-time oscillator intended for use in the bit-detection arrangement.

FIG. 4 shows an example of the discrete-time oscillator 10, which comprises an n-bit digital adder circuit 40 whose outputs are applied to an n-bit parallel-in parallel-out register 41 controlled by the sampling-clock signal cl. The outputs of the register 41 are fed back to one of the inputs of the adder circuit 40. Moreover, a digital representation of I is applied to the adder circuit 40 via a bus 42. In response to every pulse of the sampling-clock signal, this adder circuit 40 adapts the value represented by the output signal of the register 41 by the value I. The n−1 least significant bits on the output of the register 41 are applied to the phase detector 3. If the phase detector 3 is constructed to process numerical values of the "two's-complement" numerical system, the (n−1)th bit must be inverted by means of an inverter circuit 45 before it is applied to the phase detector 3.

Figure 5:
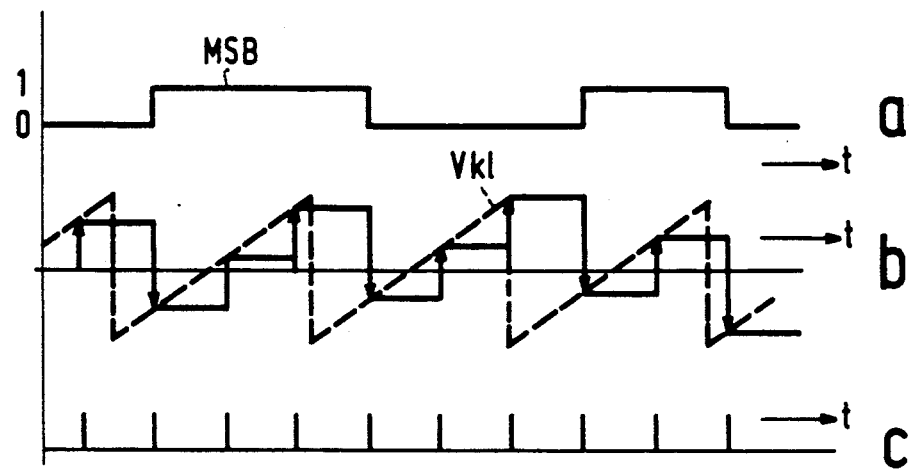

The values represented by the n−1 bits are given as a function of time in FIG. 5b. By way of illustration FIG. 5c shows the sampling-clock signal as a function of time. FIG. 5a shows the variation in time of the logic value of the most significant bit on the output of the register 41. As can be seen in FIG. 5, a change in logic value of the most significant bit (MSB) always indicates that the signal Vk1 characterized by the phase values F has been subjected to a steplike change. The n−1 significant bits representing the phase values F are fed out via the bus 43. The signal representing the logic value of the most significant bit on the output of the register 41 is fed out via a signal line 44.

Figure 6:
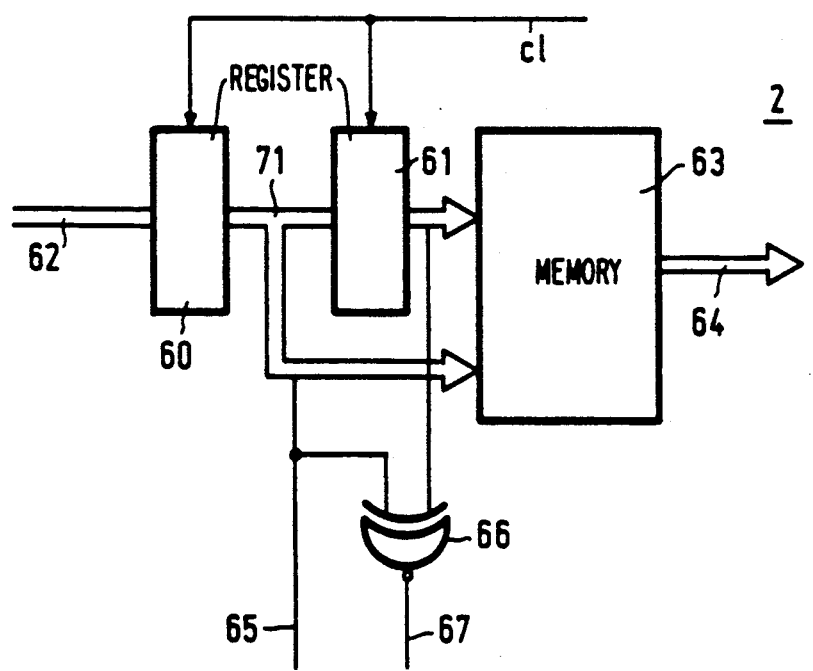
FIG. 6 shows an example of an interpolation circuit for use in the bit-detection arrangement.

FIG. 6 shows an example of the interpolation circuit 2 for determining the ratio tf/T. The interpolation circuit 2 comprises two cascaded parallel-in parallel-out registers 60 and 61, which are controlled by the sampling-clock signal cl. The digital representations of the samples J are applied to the parallel inputs of the register 60 via a bus 62 in synchronism with the sampling-clock signal cl, so that always the digital representations of two successive samples J are available on the outputs of the registers 60 and 61. The outputs of the registers 60 and 61 are applied to the address inputs of a memory 63, in which is stored, for every combination of two digital representations of samples if opposite sign, the corresponding digital representations of tf/T in the formed of a look up table. The digital representation of tf/T of the combination applied to the address inputs is output via the parallel outputs of the memory 63 and a bus 64. Moreover, the signal on the output of the register 60 which indicates the sign of the sample value stored (i.e. the most significant bit) is fed out via a signal line 65. This signal is also applied to an input of an Exclusive OR gate 66. The signal representing the sign of the sample value stored in the register 61 is applied to the other input of the gate 66, so that the output signal of the EX-OR-gate 66 always indicates whether a detection-level crossing has occurred between the samples J whose values are stored in the registers 60 and 61. The output signal of the Exclusive-OR gate 66 is fed out via a signal line 67.

The digital representations of tf/T, I and the phase values F are applied to the phase detector via the buses 69, 43 and 42, respectively, to derive the digital representation of the phase difference ΔF in conformity with the relationship (3). For this purpose the phase detector comprises a multiplier 5 for multiplying the digital representation of tf/T by the digital representation of I. The result of this multiplication is added to the digital representation of the phase value F by means of a digital adder circuit 6. The result of this adding operation is loaded into a register 8 if the load-control signal of the register 8 applied via the signal line 67 indicates that a detection-level crossing has occurred. The output signal of the register 8 is applied to the sequential digital filter 9. The signal filtered by means of the filter 9 is representative of the value I applied as control value to the discrete-time oscillator 10 and to the phase detector 2 via the bus 42. The open-loop transfer function H1(z) of the digital phase-locked-loop circuit comprising the interpolation circuit 2, the phase detector 3, the filter 9 and the discrete-time oscillator 10 characterizes the control behavior of the phase-locked-loop. This transfer function may be expressed as follows in the z-domain:

Hl(z)=Hf(z).Ho(z).K, where

Hf(z) is the transfer function of the digital sequential filter 9,

Ho(z) is the transfer function of the discrete-time oscillator 10, and

K is the sensitivity of the phase detector 3.

It is to be noted that the transfer functions of the filter 9 and the discrete-time oscillator 10 and the sensitivity K are all independent of the bit rate of data signal Vt, so that the control characteristic of the phase-locked-loop will not change when the bit rate changes, which has the advantage that the control behavior can be optimized for a large range of bit rates by a suitable choice of the transfer function of the loop filter.

Figure 7A:
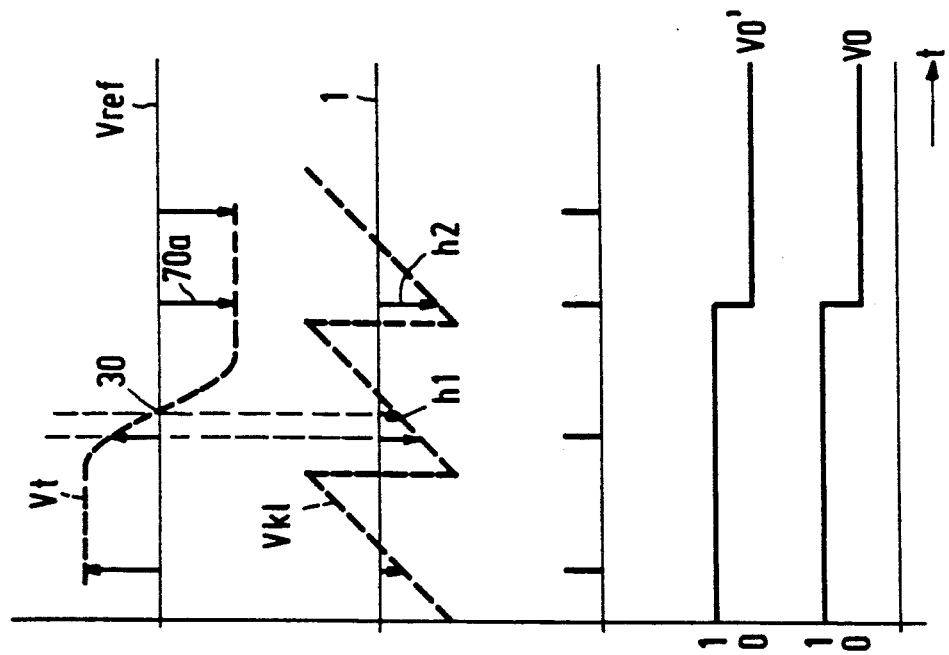
Figure 7B:
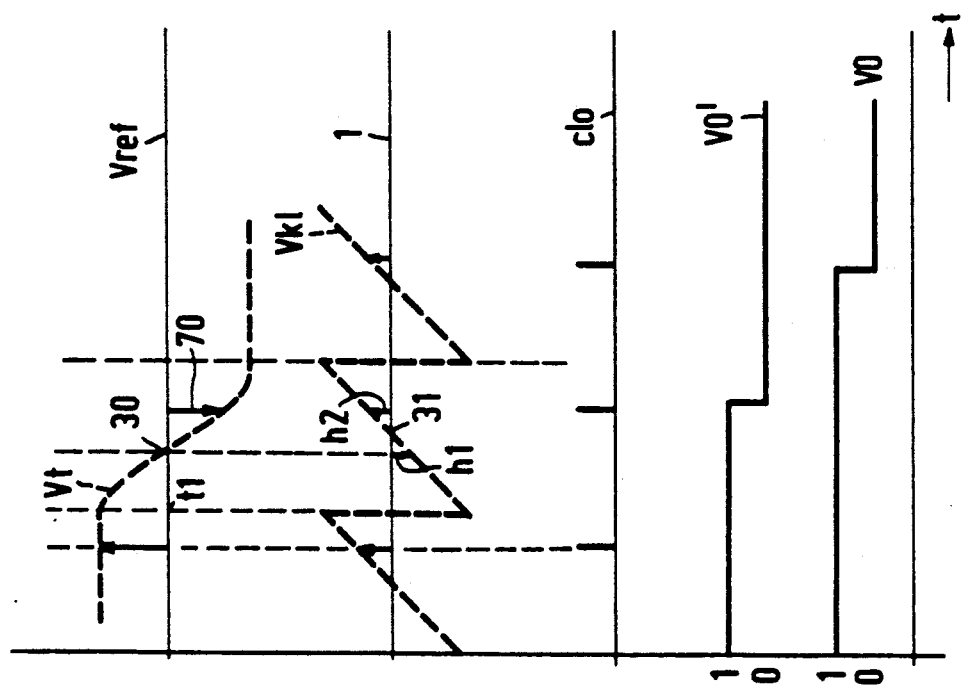

In the phase-locked-loop described in the foregoing, the signs of the data signal Vt at the instants at which the signal Vt exhibits a step change, represent the logic values of the successive bits represented by the data signal Vt. Indeed, these step changes represent the centers of the bit cells of the data signal Vt. However, the signal values of the signal Vk1 and signal values of the data signal are available exclusively at the sampling instants. The logic values of the bits, however, can also be derived from signs of the samples immediately following the step changes of the signal Vkl. However, the sign of this sample does not always correspond to the sign of the data signal Vt at the instant of the step change in the signal Vkl. As is apparent from FIG. 7a, the sign of the sample bearing the reference numeral 70 differs from the sign of the data signal at the instant t1 at which the step change has occurred. Indeed, between the step change and the sample 70, the data signal Vt has crossed the detection-level. Such a crossing can be detected by comparing the signal value h1 of the signal Vk1 at the instant at which the data signal Vt crosses the reference level with the phase value h2 at the sampling instant immediately after the step change. If the value h2 is larger than or equal to the value h1, the sign of the sample immediately following the step change will be opposite to the sign of the data signal Vt at the instant of the step change. However, if the value h2 is smaller than the value h1, the sign of the sample directly following the step change will be equal to the sign of the data signal Vt at the instant of the step change. This is illustrated in FIG. 7b. Consequently, for determining the logic value of the detected bit, it is always possible to use the sign of the sample directly following the step change provided that the logic value thus detected is inverted if the value h1 is smaller than h2. Since the value of h1 corresponds to the phase difference ΔF determined by the phase detector 3, a comparison between h1 and h2 can be carried out simply.

Figure 8A:
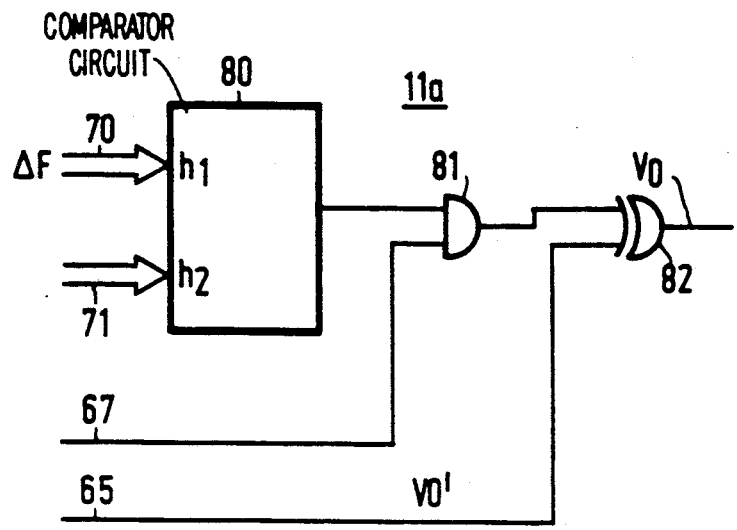
FIG. 8a–8b shows circuits for deriving a bit clock signal and a signal representative of the logic values of the detected bits.

FIG. 8a shows an example of a circuit for determining the signal Vo indicating the running value of the detected bits. The circuit 11a comprises a comparator circuit 80 for comparing the value h1 with the value h2. For this purpose the inputs of the comparator circuit 80 are coupled to buses 70 and 71. The digital representation of ΔF corresponding to the value h1 is applied via the bus 70. The output signals of the register 60, which are representative of the value h2, are applied to the comparator circuit 80 via the bus 71. The comparator circuit 80 supplies a logic "1" signal if the value h2 is greater than h1. This signal is applied to one of the inputs of a two-input AND gate 81. The other input of the AND gate 81 is connected to the signal line 67, so that the AND gate 81 produces a logic "1" signal on its output after detection of a detection level crossing for which the value h2 is greater than the value h1. This signal is applied to an Exclusive OR gate 82. The logic signal representing the sign of the sample value stored in the register 60 is applied to the other input of the Exclusive OR-gate 82, the logic signal Vo', representing the sign of the sample, then being transferred to the output of the Exclusive-OR gate 82. Only if the output signal of the AND gate 81 is a logic "1" to indicate that h2 is greater than h1 when a detection-level crossing is detected, is the signal Vo' transferred to the output in inverted form, so that the signal Vo on the output of the Exclusive OR-gate 82 always indicates the correct logic values of the detected bits. By way of illustration FIGS. 7a and 7b also show the signal Vo and Vo'.

Figure 8B:
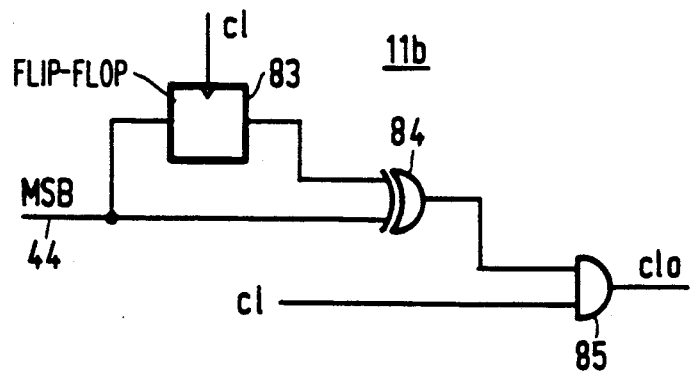

FIG. 8b shows a circuit 11b for deriving the bit clock signal clo. The signal representing the most significant bit of the digital signal on the output of the register 41 is applied to the circuit 11b via the signal line 44. As already described with reference to FIG. 5, the logic value for this signal changes of every step change of the signal Vkl, so that by comparison of the logic values of this signal at two successive sampling instants, it is possible to detect whether the signal Vk1 exhibits a step change between these two sampling instants. To detect the step change the circuit 11b comprises a flip-flop 83 controlled by the sampling-clock signal cl for delaying the signal applied via the signal line 44 by one sampling interval T. The delayed signal on the output of the flip-flop 83 and the signal on the signal line 44 are both applied to an Exclusive OR gate 84. The output signal of the gate 84 consequently always indicates whether a step change has occurred in the signal Vkl. The output signal of the gate 84 is applied to an input of a two-input AND gate 85. The sampling-clock signal cl is applied to the other input of the AND gate 85, so that after every step change of the signal Vkl, one pulse of the sampling-clock signal cl is transferred to the output of the AND gate 85. The output signal of the AND gate 85 serves as the bit clock signal clo.

It is desirable that the phase-locked-loop circuit does not lock to an incorrect frequency, for example an upper or lower harmonic of the bit rate. The likelihood of incorrect locking can be minimized by limiting the control value I of the discrete-time oscillator 10 to values between a minimum Imin and a maximum Imax. Indeed, the frequency of the discrete-time oscillator 10 is directly proportional to the control value I, so that by limiting I the frequency range of the discrete-time oscillator is also limited. Thus, it becomes impossible for the phase-locked-loop circuit to lock to a frequency outside said frequency range.

Figure 9:
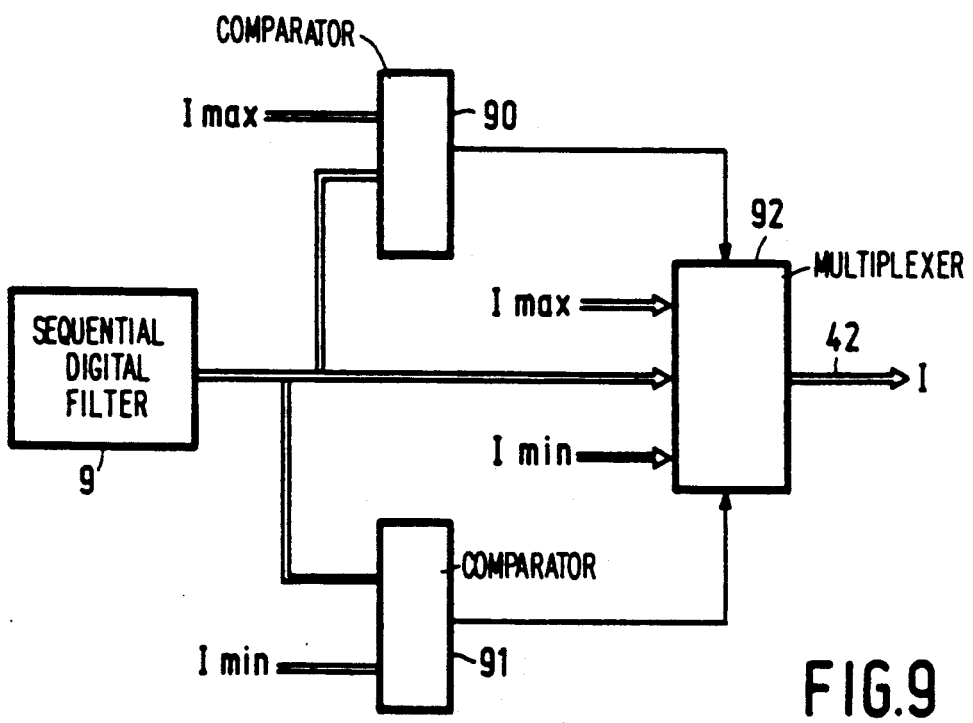
FIG. 9 shows a circuit for limiting the control value for the discrete-time oscillator.

FIG. 9 shows a circuit for limiting the control value I. The circuit can be arranged between the output of the filter 9 and the bus 42. The circuit comprises two comparator circuits 90 and 91 for comparing the output signal of the filter 9 with a lower limit Imin and an upper limit Imax, respectively.

The circuit further comprises a three-channel multiplex circuit 92, to which the output signals of the filter 9 and the digital representations of Imax and Imin are applied. The multiplex circuit 92 is controlled by the output signals of the comparator circuits 90 and 91, which signals are representative of the results of the comparisons performed by the comparator circuits 90 and 91. The multiplex circuit 92 is constructed in such a way that if the output signal of the comparator circuit 90 indicates that the output signal of the filter 9 is larger than Imax, the digital representation of Imax is transferred to the output of the multiplex circuit 92. If the output signal of the comparator circuit 91 indicates that the output signal of the filter 9 is smaller than Imin, the digital representation of Imin is transferred to the output of the multiplex circuit 92. In the other cases the output signal of the filter 9 is transferred to the output of the multiplex circuit 92.

The invention is not limited to the embodiment shown herein. For example, instead of the adder circuit 6, a subtractor circuit can be used if the sign of the relationship between the phase values F and the control value I is opposite to the sign in the present embodiment. Moreover, an amplifier having a predetermined gain or an attenuator having a predetermined attenuation may be arranged between the output of the discrete-time oscillator 10 and the adder circuit 6, for example, to adapt the loop gain of the phase-locked-loop.

The essential feature is that the signal value $\Delta F$ is a linear combination of the value F and the product of the control value I and the value tf/T.

The digital phase-locked-loop circuit described in the foregoing performs satisfactorily provided that the data signal represented by the samples J comprises a frequency component to which the phase-locked-loop can lock.

Should this frequency component of the input signal be missing for a specific time interval, for example as a result of a fault condition in the signal transmission path, the frequency of the discrete-time oscillator will be found to drift very rapidly. This has the drawback that at the instant at which the fault condition ceases, this frequency may differ considerably from the frequency component to which the loop should lock. The phase-locked-loop should then lock in again, which takes a comparatively long time and which consequently leads to an unnecessary loss of information.

The cause of this rapid change in frequency of the discrete-time oscillator will be explained hereinafter. The phase error $\Delta F$ is determined by the phase detector 3 in conformity with the aforementioned relationship (3):

$$\Delta F = Ca + I|a/(a-b)|$$

This relationship comprises two terms, namely:
the term $I.|a/(a-b)|$, and
the term Ca.

The term $I.|a(a-b)|$, representing the phase of the frequency component in the information signal, is fully arbitrary if said frequency component is missing, so that this term averages zero.

The value Ca, representing the value of the discrete-time oscillator output at the sampling instant which directly precedes a detection-level crossing, however, need not have an average value of zero.

If the frequency component in the input signal is missing, the average value of Ca is equal to the average value of the output signal of the discrete-time oscillator. It is now assumed that the frequency fDTO of the discrete-time oscillator complies with the following relationship:

$$fDTO = N/M \cdot \text{sampling rate}$$

where N and M are integers.

In that case the discrete-time oscillator will traverse the entire range exactly N times in M samples.

Figure 10:
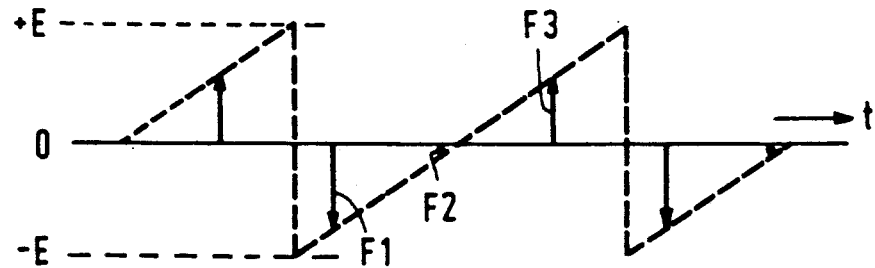
FIGS. 10, 11 and 12 by way of illustration show another embodiment of the phase-locked-loop circuit samples.

FIG. 10 gives the three successive values $F_1$, $F_2$ and $F_3$ within one period of the discrete-time oscillator in the case that N is 1 and M is 3. It is evident that in the situation illustrated in FIG. 3, the output of the discrete-time oscillator has a non-zero average. If the frequency component in the data signal drops out, the average value of the output signal $\Delta F$ will therefore also be unequal to zero, so that the frequency of the discrete-time oscillator will drift and the phase-locked-loop will act to restore the average value of the $\Delta F$ to zero by adaptation of the frequency of the discrete-time oscillator.

Figure 11:
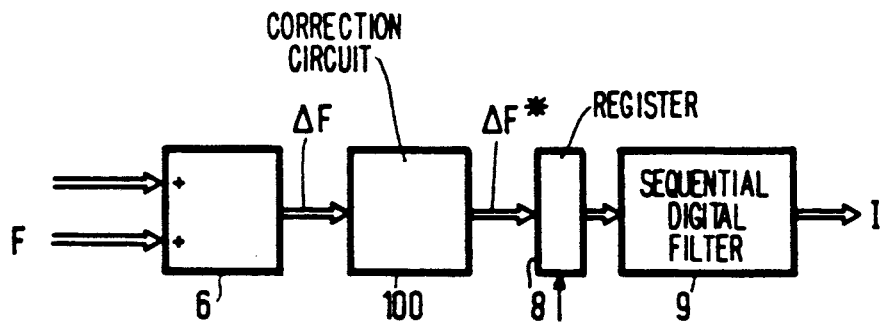

This undesired control action can be avoided by adapting the phase detector to have such a phase characteristic that the average phase error is substantially zero. This can be achieved very simply by the use of a correction circuit 100 (see FIG. 11) which is arranged between the output of the summing circuit 6 and the loop filter 9 and which has a non-linear transfer function f($\Delta F$) which complies with $$\sum_{k=0}^{n-1} f(2\pi k/N + \Delta F) = 0 \quad (4)$$

and $$\sum_{k=0}^{n-1} f'(2\pi k/N + \Delta F) = 0 \quad (5)$$

where f' is the derivative of f with respect to $\Delta f$.
The above requirement is met by $$f(\Delta F) = \sin(\Delta F) \quad (6)$$

Figure 12:
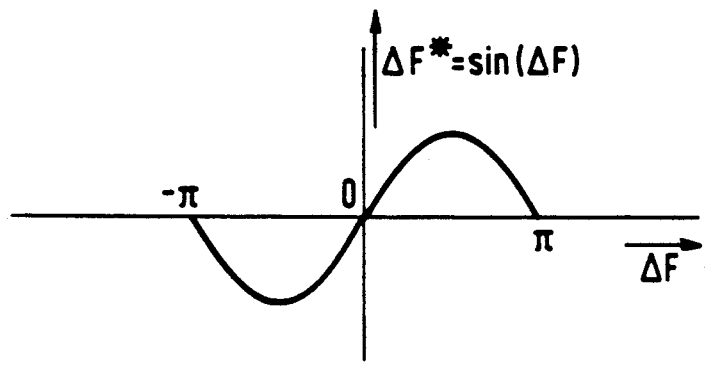

FIG. 12 is a graph of relationship (6). The correction circuit 100 can be realized very simply, for example by means of a digital memory in which the function f($\Delta F$) is stored in the form of a look-up table and whose address inputs are coupled to the output of the phase detector 3.

It will be evident that in such a correction circuit in the form of a memory the function f($\Delta F$) cannot be approximated too exactly as a result of quantization errors. However, this need not be a problem if the quantization errors remain small enough to reduce the undesirable drift in the frequency of the discrete-time oscillator to an acceptable minimum.

The invention has been illustrated for a "hard-wired" circuit. However, it will be obvious to those skilled in the art that the circuit in accordance with the invention can also be realized by means of programmable circuits.

What is claimed is:

1. A phase-locked-loop circuit for deriving, from an input sequence of samples of a band-limited data signal applied thereto, the phase of the data signal at the corresponding sampling instants, said phase-locked-loop circuit comprising signal-generating means for generating, in synchronism with the sample, a sequence of phase values characterizing a periodic signal having an amplitude which varies as a substantially linear function of time between a first and a second limit value, said first and said second limit values being constant, and a frequency which is proportional to a control value; means for deriving interpolation values from the samples by interpolation, said interpolation values being indicative of the relative positions, with respect to the sampling instants, of the instants at which the data signal crosses a detection-level; phase-comparison means for deriving, from the phase values and the interpolation values, a difference value which is indicative of the difference between the phase represented by the phase value and the phase of the data signal; and control means for controlling the signal-generating means depending on the difference value in such a way that the phase indicated by the phase value is maintained substantially equal to the phase of the data signal, characterized in that the phase-comparison means comprises means for determining a linear combination of the phase value and a product of the interpolation value and the control value for deriving the difference value, the control means varying the control value depending on the linear combination thus determined.

2. Phase-locked-loop circuit as claimed in claim 1, characterized in that the phase-comparison means comprises a multiplier for multiplying the control value by the interpolation value to form said product and an adder circuit for determining the linear combination of said product and the phase value.

3. A phase-locked-loop circuit as claimed in claim 1, characterized in that the control means comprises a sequential filter which is controlled in synchronism with a clock signal having a frequency corresponding to a sampling frequency of said input sequence of samples.

4. A phase-locked-loop circuit as claimed in any one of the preceding claims, characterized in that the control means comprise means for limiting the control value to values situated between a third limit value and a fourth limit value, said third and fourth limit values respectively corresponding to a minimum and a maximum permissible frequency of the periodic signal characterized by the phase values.

5. A phase-locked-loop circuit as claimed in claim 1, characterized in that the phase-comparison means further comprises a correction circuit for correcting the difference value, a relationship f between a corrected difference value $\Delta F^*$ and a corresponding difference value $\Delta F$, where $\Delta F^* = f(\Delta F)$, substantially complying with:

$$\sum_{k=1}^{n-1} f(2\pi k/N + \Delta F) = 0$$

and $$\sum_{k=0}^{n-1} f'(2\pi k/N + \Delta F) = 0$$

where k and N are integers and where f' is the derivative of the relationship f with respect to $\Delta F$.

6. A circuit as claimed in claim 5, characterized in that the relationship F is a sine function.

7. A circuit as claimed in claim 5 or 6, characterized in that the correction circuit comprises a digital memory in which the relationship f is stored as a look-up table.

8. A bit-detection arrangement for converting a sequence of samples of a band-limited into a binary signal made up of bit cells, said bit-detection arrangement comprises a phase-locked-loop circuit as claimed in claim 1 for deriving, from the input sequence of samples of the band-limited data signal, the phase of the data signal at corresponding sampling instants, and a circuit for deriving logic values of the bit cells from the values of the samples and the phase values thereby forming said binary signal.

9. A bit-detection arrangement as claimed in claim 8, characterized in that the signal-generating mans comprise a digital summing circuit for modifying an n-bit sum value having $n-1$ least significant bits by the control value in synchronism with a clock signal having a frequency corresponding to a sampling frequency of said sequence of samples, the $n-1$ least significant bits of said n-bit sum value representing the phase values, and the bit-detection arrangement comprising means responsive to a change in logic value of the most significant bit of the n-bit sum value to generate a clock pulse of a bit-clock signal which is in synchronism with the binary signal.

10. A bit-detection arrangement as claimed in claim 9, characterized in that the bit-detection arrangement comprises means for deriving the logic value of the bit calls from the signals of the samples at the instants at which the clock pulses of the bit-clock signal are generated; means for comparing the phase value generated immediately after the data signal crosses the detection-level with the difference value; and means for inverting the logic value of the associated bit cell when the phase value generated immediately after the data signal crosses the detection-level is greater than the difference value.

11. A phase-locked loop circuit for deriving, from an input sequence of samples of a band-limited data signal, the phase of the data signal at corresponding sampling instants, said phase-locked loop circuit comprising signal generating means for generating, in synchronism with the samples, a sequence of phase values characterizing a periodic signal having an amplitude which varies as a substantially linear function of time between a first and a second limit value, said first and said second limit values being constant, and a frequency which is proportional to a control value, means for deriving an interpolation value representing an instant, defined by the samples, at which the data signal crosses a detection level, phase comparison means for deriving from the phase values and the samples, a difference value which is indicative of the difference between the phase value and the interpolation value, and control means for controlling the signal generating means depending on the difference value is in such a way that the phase indicated by the phase value is maintained substantially equal to the phase of the data signal, characterized in that said phase comparison means comprises means for deriving as the difference value a value which substantially indicates a linear combination of the phase value and a product of the interpolation value and the control value, the control means varying the control value depending on the difference value thus determined.

* * * * *